United States Patent [19]
Yamanari

[11] Patent Number: 4,546,368
[45] Date of Patent: Oct. 8, 1985

[54] CHARGE TRANSFER DEVICE HAVING A PRECISELY CONTROLLED INJECTION RATE

[75] Inventor: Kenzo Yamanari, Tokyo, Japan

[73] Assignee: Nippon Electric Co., Ltd., Tokyo, Japan

[21] Appl. No.: 418,956

[22] Filed: Sep. 16, 1982

[30] Foreign Application Priority Data

Sep. 17, 1981 [JP] Japan .................. 56-146761

[51] Int. Cl.[4] .................. H01L 29/78; G11C 19/28
[52] U.S. Cl. .................................. 357/24; 377/60
[58] Field of Search .................. 357/24; 377/57–63

[56] References Cited

U.S. PATENT DOCUMENTS

| | | | |
|---|---|---|---|
| 4,158,209 | 6/1979 | Levine | 357/24 M |
| 4,242,600 | 12/1980 | Hoffmann et al. | 357/24 R |

FOREIGN PATENT DOCUMENTS

| | | | |
|---|---|---|---|
| 55-53458 | 4/1980 | Japan | 357/24 M |
| 2010010 | 6/1979 | United Kingdom | 357/24 M |
| 2025135 | 1/1980 | United Kingdom | 357/24 M |

Primary Examiner—Gene M. Munson
Attorney, Agent, or Firm—Sughrue, Mion, Zinn, Macpeak & Seas

[57] ABSTRACT

An input part of a charge transfer device includes first, second and third gate electrodes on a semiconductor substrate. The first gate electrode is located close to a charge injection region but far from a shift register part. The third gate electrode is located close to the shift register part but far from the charge injection region. The second gate electrode is located between the first and third gate electrodes, and comprises two partial electrodes which are formed in different forming steps. One of the partial electrodes which is far from the first gate electrode is preferably formed by the same forming step as the first gate electrode.

12 Claims, 10 Drawing Figures

CHARGE TRANSFER DEVICE HAVING A PRECISELY CONTROLLED INJECTION RATE

BACKGROUND OF THE INVENTION

This invention relates to a charge transfer device, and more particularly to an input part in the charge transfer device.

An input part in a conventional buried-channel type charge transfer device includes a semiconductor substrate of a first conductivity type, a diffusion region of a second conductivity type formed in a surface portion of the substrate, a first gate electrode hereinafter referred to as a third gate electrode provided on the semiconductor substrate close to the diffusion region, a second gate electrode provided on the semiconductor substrate close to the first gate electrode, and third gate electrode hereinafter referred to as a transfer gate electrode, provided on the semiconductor substrate close to the second gate electrode but far from the first gate electrode. The second gate electrode consists of only a single layer electrode which is usually different from the layer forming the first and third gate electrodes. Since the dimension of this single layer electrode, which determines the amount of charges to be introduced into the charge transfer device, is apt to be affected by manufacturing errors such as under- or over-etching of the electrode material, the accuracy of the charge injection rate depends on the accuracy of the dimension of the second gate electrode.

First, a conventional charge transfer device will be described with reference to FIGS. 1, 2, and 3. FIG. 1 is a plan view of the portion of a conventional charge transfer device which is in the vicinity of an input part therein, and FIG. 2 a sectional view taken along the line A-A' in FIG. 1. A diffusion region 1 formed on a P-type semiconductor substrate 4 is an N-type region, and is connected to a wiring layer 2 of aluminum through a connecting portion 2'. This diffusion region 1 serves as a charge injection region, to which an electrical potential is applied from the outside through the wiring 2. A first gate electrode 11 is formed on the substrate via an insulating oxide film 5 so that its one side may be aligned with one side of the diffusion region 1. A second gate electrode 21 is formed in the oxide film 5 close to the first gate electrode 11, and third gate electrodes 31, 32 close to the second gate electrode 21, the electrode 31 comprising a transfer gate electrode. The third gate electrodes 31, 32 are connected to each other through a connecting portion 30 so as to function as a single electrode. Reference numeral 12 denotes an aluminum wiring for the first electrode 11, and 23 an aluminum wiring for the second gate electrode 21. The third gate electrodes 31, 32 are commonly connected via wiring 53 to a clock signal of a shift register operating in a charge transfer manner. Electrodes 41 and 42; and electrodes 51 and 52 of the shift register are connected to each other via connecting portions 40, 50, respectively, to form transfer gate electrodes of the shift register and these electrodes are connected to clock wires 43, 53. In this example, 2-phase clocks are applied through the wirings 43 and 53, respectively. Reference numeral 3 denotes a channel region in which charges are transferred. The electrodes 21, 32, 42, 52 which are shown in broken line in FIG. 1 are made of a first polysilicon layer formed on the oxide film 5, while the electrodes 11, 31, 41, 51, which are shown in solid line in the same figure, are made of a second polysilicon layer formed in a step after the formation of the first polysilicon layer.

The cross-sectional construction of this example will be described in detail with reference to FIG. 2. The polysilicon electrodes 11, 21, 31, 32, 41, 42, 51, 52 are formed on the P-type semiconductor substrate 4 via the insulating oxide film 5 by two different depositions of polysilicon as mentioned above. The side and upper surface of the electrodes 21, 32, 42, 52 are covered by a thermally oxided film to maintain isolation from the electrodes 11, 31, 41, 51. The charge transfer section has a buried-channel construction, and an N-type region 6 is thus formed on the P-type semiconductor substrate 4. Further, in order to transfer charges in a predetermined direction, P-type regions 7 are formed under the electrodes 41, 51 of the second polysilicon layer.

The injection of charges into the above charge transfer device will now be described in the context of a generally-used potential balancing method. FIG. 3a is a sectional view of an input part including the N-type region 1, the first, second and third gate electrodes G1, G2 and G3 and a part of the N-type channel region 6, and FIGS. 3b–3d are diagrams of electric potential versus time showing the steps of charge injection according to the potential balancing method. The charge injection operation is begun by making the electric potential at the input N-type region 1 higher than that in a first gate electrode G1. At this time, as shown in FIG. 3b, the charge flows into a potential well under second gate electrode G1. Thereafter, the electric potential at the input N-type region is made lower than that of the first gate electrode G1 to leave charges in the potential well under the second gate electrode G2, as shown in FIG. 3c. The excess charge flows back to the input N-type region 1. Consequently, the amount of charges left in the electric potential well under the second gate electrode G2 corresponds to the difference between the electric potentials under the first and second gate electrodes G1 and G2. These charges are sent to the N-type region 6 of the shift register by lowering the potential under a third gate electrode G3, as shown in FIG. 3d. The charge transfer rate Q can be expressed by the following formula:

Qα (difference between electric potentials of G1 and G2) x (area of the gate G2).

Here, while the difference between the electric potentials under the gate electrodes G1 and G2 is controlled by externally applied gate voltages, the area of the gate electrode G2 is strongly affected by the inevitable manufacturing errors. In other words, the injection rate Q depends substantially upon the length of the second gate electrode G2, i.e. the length "l" of the channel under the second gate electrode G2 shown in FIG. 3a, and the channel length "l" under the second gate G2 varies with the etching conditions in the manufacturing of the second gate G2. More particularly, in case of over-etching, the length "l" becomes shorter, and in case of under-etching, the length "l" becomes longer. It is difficult, especially in a wet etching process, to control the etching precisely. Therefore, the channel length "l" under the second gate G2 cannot be precisely controlled. Particularly, when the second gate electrode G2 is formed in a fine pattern, it is convenient to use a smaller channel length "l". However, as the channel length "l" is shortened, the percentage variation due to manufacturing errors becomes longer. As described above, the conventional charge transfer device has a disadvantage that the charge transfer rate is greatly influenced by the channel length "l" of channel under the second gate electrode G2. A charge transfer device which can precisely control the rate of charge injection has been strongly desired, because the injection rate is an important feature of the charge transfer device. While the operation has been explained above in the context of the potential balancing method, the deviation of the charge injection rate in the diode cut-off method similarly depends on the area of the channel under the second gate G2.

SUMMARY OF THE INVENTION

An object of the present invention is to eliminate the above-mentioned drawbacks encountered in a conventional charge transfer device, and to provide a new charge transfer device which can precisely control a charge injection rate.

According to the present invention, a charge transfer device comprises a semiconductor substrate of a first conductivity type, a diffusion region of a second type provided on the semiconductor substrate, and an input, or charge injection, part which includes a first gate electrode isolatedly provided on the semiconductor substrate close to the diffusion region, a second gate electrode isolatedly provided on the semiconductor substrate close to the first gate electrode, a third gate electrode isolatedly provided on the semiconductor substrate close to the second gate electrode, and a charge receiving region located close to the third gate electrode, the second gate electrode being divided into a first layer electrode and a second layer electrode. Especially, it is desirable that the first gate electrode is formed in the same manufacturing step as that forming the one of the first and second layer electrodes of the second gate electrode which is far from the first gate electrode.

According to the present invention, the channel length "l" under the second gate is determined by the position of such ends of the first gate electrode and first layer electrode of the second gate electrode that are on the same side. Therefore, even when over-etching or under-etching occurs during manufacturing of the charge transfer device, the channel length "l" does not vary. Thus, the deviation of the charge injection and transfer rates is very small. This is particularly advantageous when the charge transfer device is utilized for processing analog signals. Further, while the width of the channel in a direction perpendicular to the transfer direction may be set to as large as 20-50 μm, the length "l" thereof in parallel to the transfer direction should be small. Accordingly, since the deviation in channel length is reduced according to the present invention, it is permissible to make the channel length very small, thus reducing the distance between the diffusion region 1 and shift register. This permits the transfer device according to the present invention to be operated at higher speeds than with a conventional structure.

DETAILED DESCRIPTION OF THE INVENTION

Figure 1:
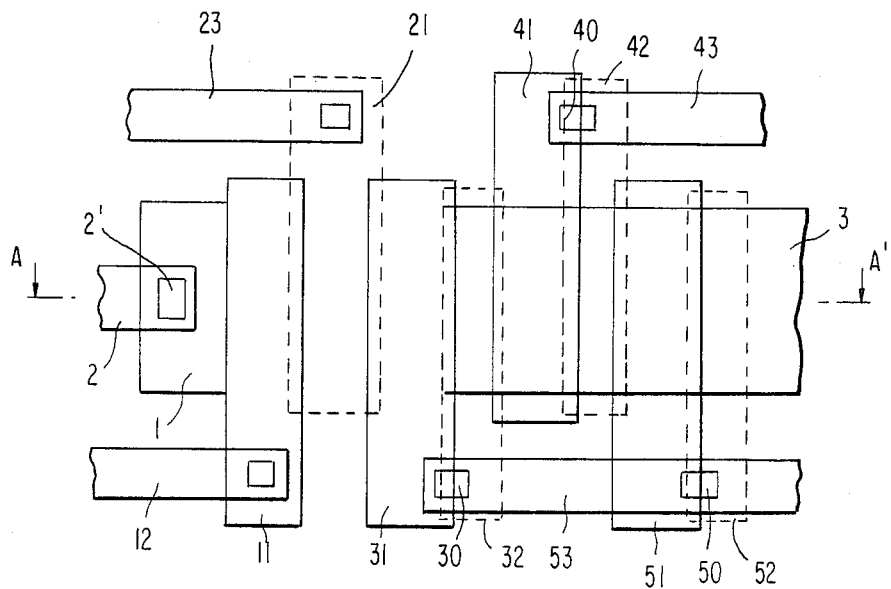
FIG. 1 is a plan view of a conventional charge transfer device.
Figure 2:
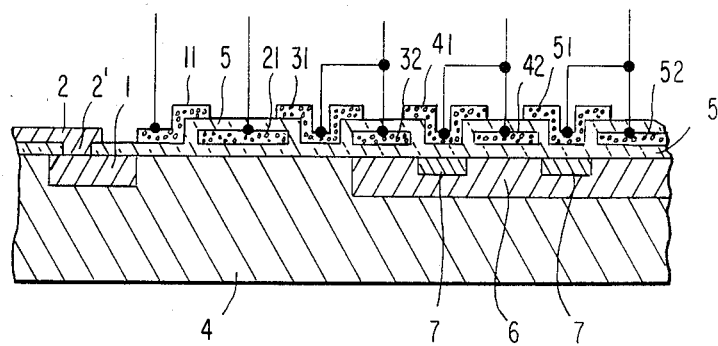
FIG. 2 is a sectional view taken along the line A-A' in FIG. 1.
Figure 3A:
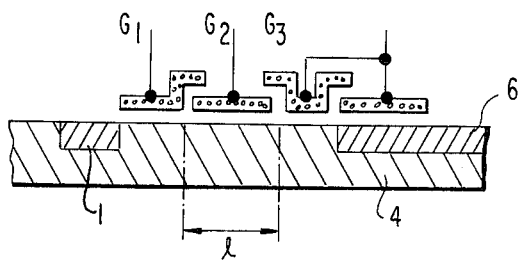
FIG. 3a is a schematic sectional view of the input part of a conventional charge transfer device and FIGS. 3b, 3c and 3d are diagrams of electric potential which show steps of the charge injection operation.
Figure 3B:
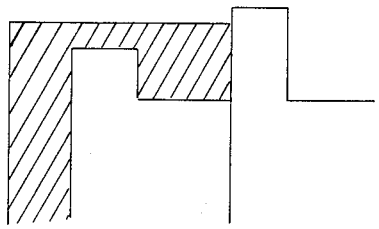
Figure 3C:
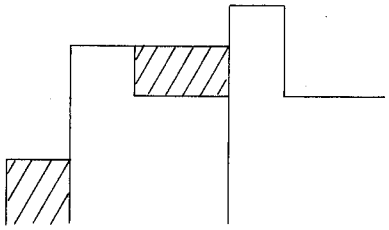
Figure 3D:
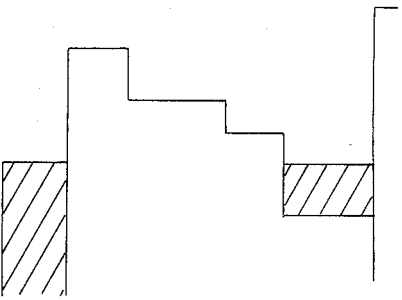
Figure 4:
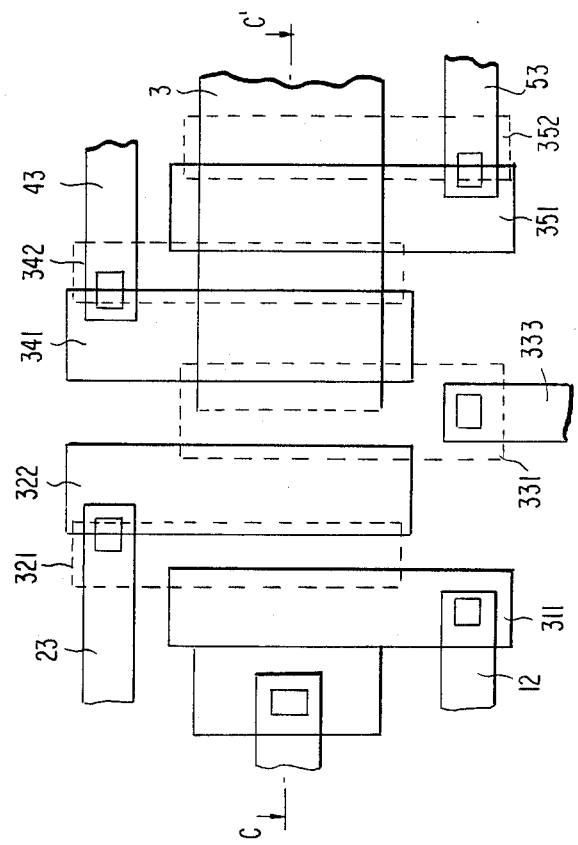
FIG. 4 is a plan view of the input part of a transfer device according to a first embodiment of the present invention.
Figure 5:
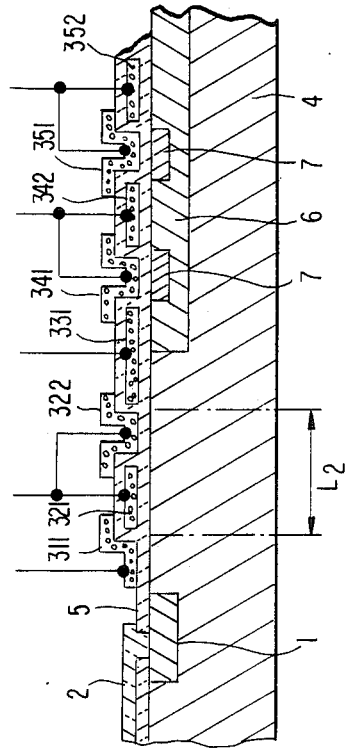
FIG. 5 is a sectional view taken along the line B-B' in FIG. 4.

The first embodiment of the present invention will be explained with reference to FIGS. 4 and 5. The fundamental structure is similar to the conventional charge transfer device shown in FIGS. 1 and 2; therefore, the same reference numerals are used in the description of the first embodiment except for the first gate electrode 11' and the first and second partial electrodes 221, 222, both of which comprise a second gate electrode corresponding to the second gate electrode 21 of the conventional charge transfer device.

An N-type region 1 operating as a charge producing region and an N-type region 6 allowing charges to transfer therethrough are formed in a P-type substrate 4. Because of the existence of the N-type region 6, this charge transfer device operates as a buried-channel type. A plurality of P-type regions are formed in the N-type region 6 to determine the transfer direction of charges. A hole exposing the N-type region 1 is made in the oxide layer 5 formed after or during the formation of the P-type regions 7. A metal wiring 2 is connected to the N-type region 1 in the hole.

All the electrodes 11', 221, 222, 31, 32, 41, 42, 51, 52 . . . are made of polysilicon and are formed by two deposition steps. First, the electrodes 11', 222, 32, 42, 52 . . . are formed on the oxide layer 5 by a polysilicon deposition. After the first deposited polysilicon is shaped into a plurality of separate electrodes, the surfaces of those separate electrodes are oxidized. Thereafter, the other electrodes 221, 31, 41, 51 . . . are formed by a second deposition of polysilicon and an etching. Respective pairs of electrodes made of first and second deposited polysilicon portions are connected at the outside of the N-type region 6 by wirings 43 and 53, as shown in FIG. 4.

As mentioned above, this embodiment has a second gate electrode formed of the second deposited polysilicon electrode 221 which is the first partial electrode and first deposited polysilicon electrode 222 which is the second partial electrode. According to this structure, the total length L, is determined by a distance between the right end of the first gate electrode 11' and the right end of the second partial electrode 222. This total length $L_1$ depends upon the accuracy of the etching mask but it is not substantially influenced by the conditions in etching the gate electrode 11' and second partial electrode 222 since these are formed under the same conditions and are etched under the same conditions. Thus, their right ends will vary by equal amounts. Further, the variation in the gap between the first gate electrode and second partial electrode will be compensated by a corresponding variation in the dimension of the first partial electrode which is to be later deposited.

Thus, since the total length $L_1$ of the second gate electrode can be kept constant, the charge injection rate can be controlled satisfactorily by the voltages applied to the first and second gate electrodes only, and a charge transfer device having excellent characteristics can be obtained. Also, the distribution of the total length $L_1$ between the pellets and between the wafers can be minimized, and the production yield of the device can be improved. Further, the thicknesses of the oxide layer 5 under the first and second partial electrodes 221 and 222 are preferably the same to prevent a potential difference on the substrate 4 thereunder from occurring. The device having such gate oxide layers of the same thickness can be used conveniently; however, forming the oxide layer 5 in the above-mentioned manner is not strictly necessary.

Figure 6:
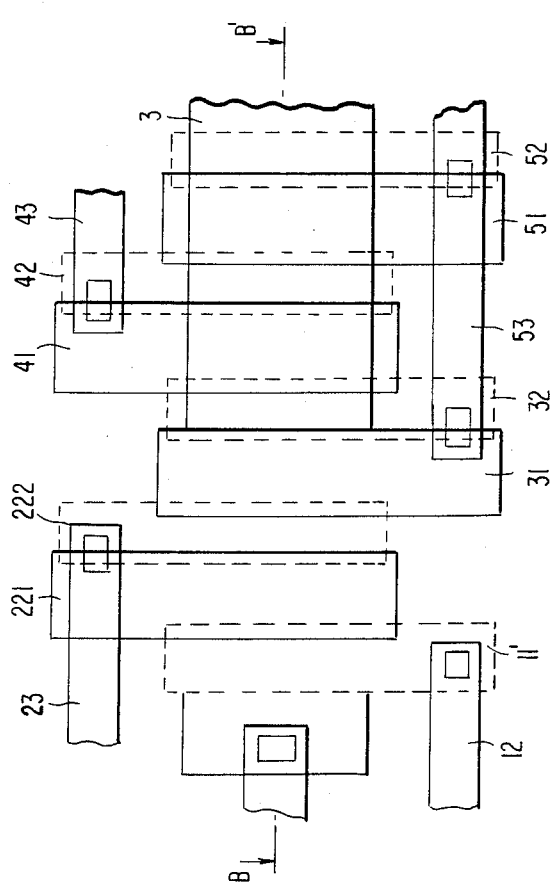
FIG. 6 is a top plan view of the input part of a transfer device according to a second embodiment of the present invention.
Figure 7:
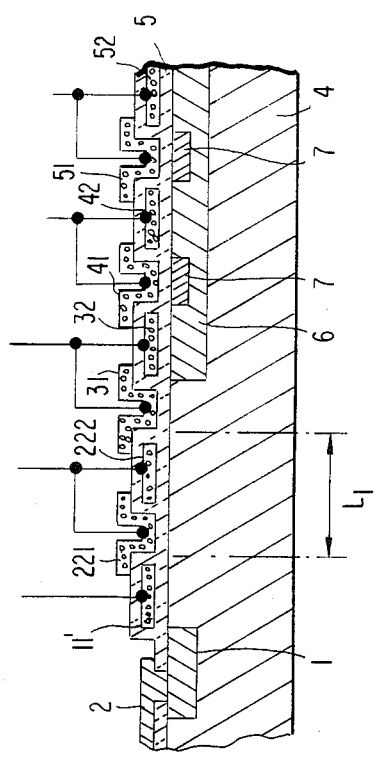
FIG. 7 is a sectional view taken along the line C-C' in FIG. 6.

Next, a second embodiment will be explained with reference to FIGS. 6 and 7. The P-type substrate 4, the N-type regions 1 and 6, the P-type regions 7, the insulating oxide layer 5 and the wiring layer 2 are constructed similarly to the first embodiment shown in FIGS. 4 and 5. Therefore, the same reference numerals are used.

The difference is in the gate electrodes 311, 331, 341, 342, 351, 352 . . . and the first and second partial electrodes 321 and 322 which operate as a second gate electrode. In this embodiment, a polysilicon layer for forming the first partial electrode 321, the third gate electrode 331 and the transfer gate electrodes 342, 352 . . . is first deposited on the insulating oxide layer 5. After the first deposited polysilicon layer is subjected to etching and surface oxidation, another polysilicon layer is deposited. This second deposited polysilicon layer is subjected to etching to form the first gate electrode 311, the second partial electrode 322 and other transfer gates 341, 351 . . . . Namely, the first and second deposited polysilicon layers are used in the opposite manner of the first embodiment in the charge input, or injection, part consisting of the first, second and third gate electrodes. Further, the third electrode 331 is formed by a single layer of the first deposited polysilicon layer. The remaining construction is the same as in the first embodiment. In this second embodiment, the second gate electrode is also formed with the first partial electrode 321 formed by the first layer of polysilicon and the second partial electrode 322 formed by the second deposited polysilicon layer. Furthermore, both of the first gate electrode 311 and the second partial electrode 322 are made of the same second deposited polysilicon layer. Therefore, the length $L_2$ of a channel under the second gate is determined by the distance between the left end of the first partial electrode 321 and the left end of the third gate electrode 331. Thus, as in the first embodiment, the two electrode portions defining the length of the channel are both formed in the same step. This embodiment also permits, just as the first embodiment, the providing of a charge transfer device having a small deviation of the charge injection rate.

As described above, by constructing the second gate electrode with the first and second deposited layers, a charge transfer device having a small deviation of the charge injection rate can be provided. Accordingly, the present invention is capable of providing a charge transfer device suited for an analog operation and having excellent characteristics.

In the embodiments of the present invention, a buried-channel type is used as the shift register part, but it may instead be a surface channel type or other type. Further, since the present invention relates to a charge input part in a charge transfer device, it is apparent to those skilled in the art that the invention can be applied to any other charge transfer device which provides a charge input part, such as linear image sensors, area image sensors, and delay lines.

What is claimed is:

1. A charge transfer device, comprising:
a semiconductor substrate;
charge producing means for producing charges in said semiconductor substrate;
a charge transferring section formed on said semiconductor substrate and displace from said charge producing means in a charge transferring direction;
a first insulating layer formed on said substrate and having a uniform thickness;
a first gate electrode formed on said first insulating layer adjacent said charge producing means;
a second partial electrode formed on said first insulating layer between said first gate electrode and said transferring section;
a second insulating layer formed over said first gate electrode and second partial electrode;
a first partial electrode having parts formed over said second insulating layer and partially overlapping said first gate electrode and second partial electrode with the remainder of said first partial electrode being formed on said first insulating layer positioned between said first gate electrode and said second partial electrode, said first and second partial electrodes being formed over a portion of said substrate having a uniform impurity concentration and being connected together to form a second gate electrode; and
means for applying the same electric field to said first and second partial electrodes.

2. A charge transfer device as claimed in claim 1, further comprising a third gate electrode formed over said first insulating layer adjacent said transferring section and between said second gate electrode and said transferring section.

3. A charge transfer device as claimed in claim 1, wherein said charge transfer section comprises a semiconductor region formed in said substrate and having a conductivity type opposite to that of said semiconductor substrate, and a plurality of transfer gate electrodes disposed on but isolated from said semiconductor region.

4. A charge transfer device as claimed in claim 3, wherein said plurality of transfer gate electrodes are isolated from said semiconductor region by said first insulating layer.

5. A charge transfer device as claimed in claim 3, wherein each of said plurality of transfer gate electrodes comprises a first electrode portion disposed on said first insulating layer, said second insulating layer covering said first electrode portions, and a second electrode portion disposed at least partially over said second insulating layer and overlapping two of said first electrode portions in said charge transferring direction.

6. A charge transfer device as claimed in claim 3 or 5, wherein said charge producing means is another semiconductor region formed in said substrate and having a conductivity opposite to that of said semiconductor substrate.

7. A charge transfer device, comprising:
a semiconductor substrate;
charge producing means for producing charges in said semiconductor substrate;
a charge transferring section formed on said semiconductor substrate and displaced from said charge producing means in a charge transferring direction;

a first insulating layer formed on said substrate;

a first partial electrode formed on said first insulating layer;

a second insulating layer covering said first partial electrode;

a first gate electrode formed over at least a portion of said second insulating layer and disposed between said first partial electrode and said charge producing means; and a second partial electrode formed over at least a portion of said second insulating layer and disposed between said first partial electrode and said charge transferring section, said first and second partial electrodes being electrically connected together to form a second gate electrode.

8. A charge transfer device as claimed in claim 7, wherein said first partial electrode overlaps in said charge transferring direction with each of said first gate electrode and second partial electrode.

9. A charge transfer device as claimed in claim 8, wherein said charge transferring section comprises a region of a conductivity type opposite that of said substrate and formed in said substrate, said device further comprising a third gate electrode disposed over said region and between second gate electrode and said region.

10. A charge transfer device of the type including a semiconductor substrate, a charge producing means for producing charges in said semiconductor substrate, a charge transferring section formed on said substrate and displaced from said charge producing means along a charge transferring direction, a first gate electrode over said substrate adjacent said charge producing means, a second gate electrode over said substrate adjacent said first gate electrode in said charge transferring direction and a third gate electrode disposed over said substrate between said second gate electrode and said charge transferring section, the improvement characterized in that said second gate electrode comprises a first partial electrode formed at a time different from said first gate electrode and a second partial electrode formed at the same time as said first gate electrode and disposed between said first partial electrode and said third gate electrode, and said first gate electrode, said first partial electrode and said second partial electrode are formed on a first insulating film formed over said semiconductor substrate with a uniform thickness, said device further including a second insulating layer covering said first gate electrode and said second partial electrode, and said first partial electrode having side portions overlapping said first gate electrode and said second partial electrode but being physically isolated therefrom by said second insulating layer, and said first and second partial electrodes being electrically connected together to form a potential well having a uniform depth in said substrate.

11. A charge transfer device of the type including a semiconductor substrate, a charge producing means for producing charges in said semiconductor substrate, a charge transferring section formed on said substrate and displaced from said charge producing means along a charge transferring direction, a first gate electrode over said substrate adjacent said charge producing means, a second gate electrode over said substrate adjacent said first gate electrode in said charge transferring direction and a third gate electrode disposed over said substrate between said second gate electrode and said charge transferring section, the improvement characterized in that said second gate electrode comprises a first partial electrode formed at a time different from said first gate electrode and a second partial electrode formed at the same time as said first gate electrode and disposed between said first partial electrode and said third gate electrode, said first gate electrode, said first partial electrode and said second partial electrode are formed on a first insulating film formed over said semiconductor substrate with a uniform thickness, a second insulating layer being formed over said first partial electrode, said first gate electrode and second partial electrode having side portions which overlap said first partial electrode but are physically isolated therefrom by said second insulating layer, and said first and second partial electrodes being electrically connected together to form a potential well having a uniform depth in said substrate.

12. A charge transfer device of the type including a semiconductor substrate, a charge producing means for producing charges in said semiconductor substrate, a charge transferring section formed on said substrate and displaced from said charge producing means along a charge transferring direction, a first gate electrode over said substrate adjacent said charge producing means and a second gate electrode over said substrate adjacent said first gate electrode in said charge transferring direction, the improvement characterized in that:

said second gate electrode comprises a first partial electrode formed at a time different from said first gate electrode and a second partial electrode formed at the same time as said first gate electrode and disposed between said first partial electrode and said charge transferring section, said first and second partial electrodes being physically isolated from one another but electrically connected together;

said device further comprises a third gate electrode having at least a portion formed at the same time as said first partial electrode, said portion of said third gate electrode being disposed over said substrate between said second gate electrode and said charge transferring section; and said device further comprises a first insulating layer formed over said substrate with said first partial electrode and third gate electrode portion being formed on said first insulating layer, and a second insulating layer covering said first partial electrode and third gate electrode portion with said first gate electrode and second partial electrode being formed at least partially over said second insulating layer.

* * * * *